United States Patent
Chiao et al.

(10) Patent No.: US 9,881,901 B2
(45) Date of Patent: Jan. 30, 2018

(54) STACKED PACKAGE DEVICE AND METHOD FOR FABRICATING THE SAME

(71) Applicant: WINBOND ELECTRONICS CORP., Taichung (TW)

(72) Inventors: Yu-Cheng Chiao, Taichung (TW); Tung-Yi Chan, Taichung (TW); Chen-Hsi Lin, Taichung (TW); Chia Hua Ho, Hsinchu (TW); Meng-Chang Chan, Taichung (TW); Hsin-Hung Chou, Changchua (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 15/015,919

(22) Filed: Feb. 4, 2016

(65) Prior Publication Data

US 2016/0329305 A1 Nov. 10, 2016

(30) Foreign Application Priority Data

May 8, 2015 (CN) .......................... 2015 1 0230568

(51) Int. Cl.
  *H01L 21/44* (2006.01)
  *H01L 25/065* (2006.01)
  *H01L 25/00* (2006.01)

(52) U.S. Cl.
  CPC .......... *H01L 25/0657* (2013.01); *H01L 25/50* (2013.01); *H01L 2224/48091* (2013.01); *H01L 2225/06506* (2013.01); *H01L 2225/06582* (2013.01); *H01L 2924/181* (2013.01)

(58) Field of Classification Search
  CPC ... H01L 25/0657; H01L 25/18; H01L 25/105; H01L 25/50; H01L 2225/06582; H01L 2225/06506
  See application file for complete search history.

(56) References Cited

U.S. PATENT DOCUMENTS

| | | |
|---|---|---|
| 2014/0252584 A1 | 9/2014 | Spory |
| 2015/0021628 A1 | 1/2015 | Medendorp, Jr. et al. |
| 2015/0091118 A1 | 4/2015 | Sato et al. |
| 2016/0204073 A1* | 7/2016 | Beak ..................... H01L 23/295 455/418 |

* cited by examiner

*Primary Examiner* — (Vikki) Hoa B Trinh
(74) *Attorney, Agent, or Firm* — Muncy, Geissler, Olds & Lowe, P.C.

(57) ABSTRACT

A method for fabricating a stacked package device is provided. A second substrate is adhered onto a first substrate. The first substrate includes a plurality of first bonding pads, and the second substrate includes a plurality of second bonding pads. A three-dimensional (3D) printing is performed to form an encapsulating layer covering the first substrate and the second substrate and to form a plurality of bonding wires in the encapsulating layer. Each bonding wire includes a first portion connected to one of the plurality of first bonding pads. The disclosure also provides a stacked package device formed by such a method.

7 Claims, 2 Drawing Sheets

STACKED PACKAGE DEVICE AND METHOD FOR FABRICATING THE SAME

CROSS REFERENCE TO RELATED APPLICATIONS

This application claims the benefit of China Patent Application No. 201510230568.7 filed on May 8, 2015, entitled "STACKED PACKAGE DEVICE AND METHOD FOR FABRICATING THE SAME" which is hereby incorporated herein by reference.

BACKGROUND

1. Field of the Disclosure

The present disclosure relates to a semiconductor technology, and in particular, it relates to a stacked package device fabricated by using a three-dimensional (3D) printing technology.

2. Description of the Related Art

As demand increases for electronic products such as digital cameras, camera phones, and displays, semiconductor technology for products made therefrom must develop rapidly, especially as product trends show an increased requirement for the semiconductor chip size to be miniaturized, and for the functionality of the semiconductor chip to be increased and become more complex.

Typically, a semiconductor chip includes an integrated circuit including interconnect structures. The surface of the semiconductor chip includes exposed bonding pads that are electrically connected to the interconnect structures. The semiconductor chip can be electrically connected to an exterior circuit through these bonding pads. The semiconductor chip is typically placed in a sealed package, due to performance demands, for operational stability.

Wire bonding and encapsulation molding processes are typically performed on the semiconductor packages to form a stacked package device for electrically connecting to the exterior circuit. Metal wires are employed to connect the exterior circuit from the bonding pads of the semiconductor chip while the wire bonding process is being performed. An encapsulation molding process is performed after the wire bonding process, to protect the semiconductor chip and the metal wires.

However, metal wires are easily oxidized because they are exposed to the external environment before the encapsulation molding process is performed. As a result, the resistance of the metal wires is increased. Moreover, as the semiconductor chip size is to be miniaturized, and the complexity of the design of the semiconductor chip is to be increased, problems may arise with the shifting, bridging and/or breakage of metal wires due to the molding compound used during the encapsulation molding process, and this results in a reduction of the overall reliability of the stacked package device. Therefore, there is a need to develop a method for fabricating a stacked package device capable of addressing the problems described above.

SUMMARY

In some embodiments of the disclosure, a method for fabricating a stacked package device is provided. The method includes adhering a second substrate onto a first substrate. The first substrate includes a plurality of first bonding pads, and the second substrate includes a plurality of second bonding pads. A three-dimensional (3D) printing is performed to form an encapsulating layer covering the first substrate and the second substrate and to form a plurality of bonding wires in the encapsulating layer. Each bonding wire includes a first portion connected to one of the plurality of first bonding pads.

In some embodiments of the disclosure, a stacked package device is provided. The stacked package device includes a first substrate having a plurality of first bonding pads. A second substrate is adhered onto the first substrate. The second substrate has a plurality of second bonding pads. An encapsulating layer covers the first substrate and the second substrate. There is a plurality of bonding wires in the encapsulating layer. Each bonding wire includes a first portion connected to one of the plurality of first bonding pads. The encapsulating layer and the plurality of bonding wires are formed of materials that are used in a 3D printing.

BRIEF DESCRIPTION OF THE DRAWINGS

The present disclosure can be further understood by reading the subsequent detailed description and examples with references made to the accompanying drawings, wherein.

DETAILED DESCRIPTION

Figure 1A:
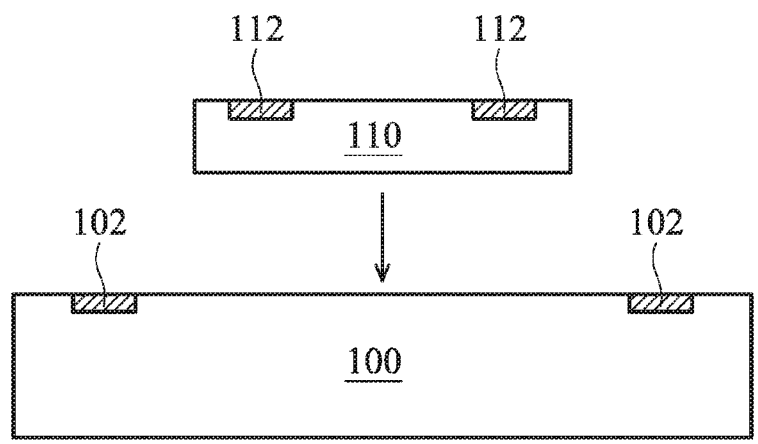
FIGS. 1A to 1B and 1B-1 are cross sections of a method for fabricating a stacked package device according to various embodiments of the present disclosure.

The following description is of the best-contemplated mode of carrying out the disclosure. This description is made for the purpose of illustrating the general principles of the disclosure and should not be taken in a limiting sense. These are, of course, merely examples and are not intended to be limited. In addition, the disclosure may repeat reference numerals and/or letters in the various examples. This repetition is for the purpose of simplicity and clarity and does not in itself dictate a relationship between the various embodiments and/or configurations discussed.

Figure 1B:
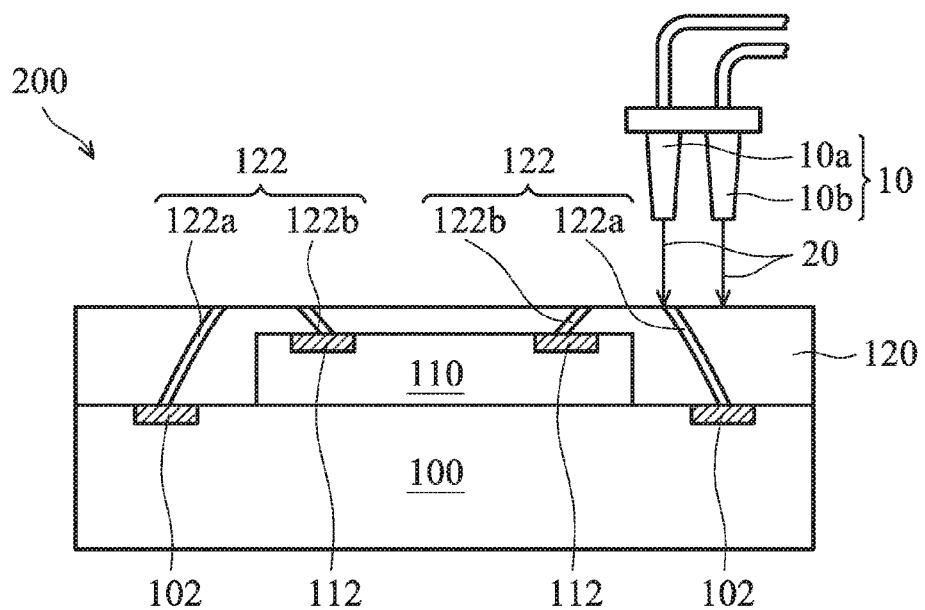

FIG. 1B illustrates a cross section of an exemplary embodiment of a stacked package device according to the present disclosure. In the embodiment, the stacked package device 200 includes a first substrate 100, a second substrate 110, an encapsulating layer 120 and a plurality of bonding wires 122. In one embodiment, the first substrate 100 may include a PCB, a wafer, a chip, or a combination thereof. Moreover, the first substrate 100 includes a plurality of first bonding pads 102 on the surface thereof. Note that the number of the first bonding pads 102 is based on the demands of the design and is not limited to that shown in FIG. 1B. Here, in order to simplify the diagram, only two first bonding pads 102 are depicted.

The second substrate 110 is adhered onto the first substrate 100. The size of the second substrate 110 may be the same as or smaller than that of the first substrate 100. In one embodiment, the second substrate 110 may include a wafer, a chip, or a combination thereof. Moreover, the second substrate 110 includes a plurality of second bonding pads 112 on the surface thereof. Note that the number of second bonding pads 112 is based on the demands of the design and is not limited to that shown in FIG. 1B. Here, in order to simplify the diagram, only two second bonding pads 112 that correspond to the first bonding pads 102 are depicted.

The encapsulating layer 120 covers the first substrate 100 and the second substrate 110. Moreover, the plurality of bonding wires 122 are in the encapsulating layer 120. In the embodiment, each bonding wire 122 has a first portion 122a and a second portion 122b, in which the first portion 122a of the bonding wire 122 is connected to one of the plurality of first bonding pads 102 of the first substrate 100, and the second portion 122b of the bonding wire 122 is connected to one of the plurality of second bonding pads 112 of the second substrate 110. As shown in FIG. 1B, the first portion 122a and the second portion 122b of the bonding wire 122 are separated from each other by the encapsulating layer 120, so that the first portion 122a and the second portion 122b of the bonding wire 122 respectively has one end exposed from the encapsulating layer 120. In one embodiment, a chip or wafer (not shown) may additionally be disposed over the encapsulating layer 120. In this case, the separated first portion 122a and second portion 122b of the bonding wire 122 can be connected by bonding pads on this chip or wafer.

In the embodiment, the encapsulating layer 120 and the plurality of bonding wires 122 are formed of materials that are used in 3D printing. For example, the encapsulating layer 120 may include a molding compound material, a ceramic material, a polymer material, a resin material, or a dielectric material used in 3D printing technology. Moreover, the plurality of bonding wires 122 may include a conductive metal used in 3D printing technology, such as gold, silver, copper, aluminum, their alloys, or other metal alloys.

Figures 1, 1B:
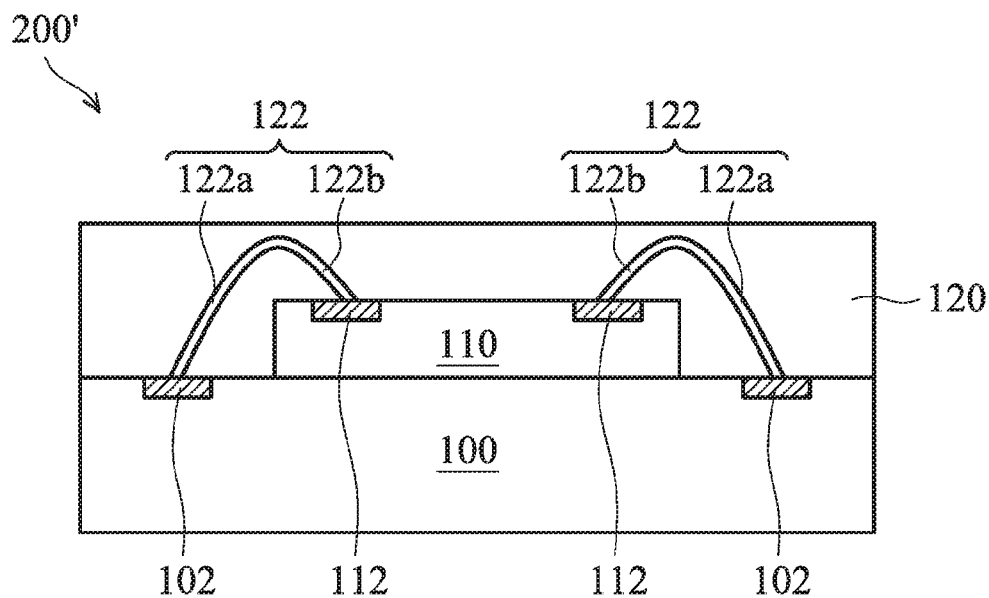

Referring to FIG. 1B-1, which illustrates a cross section of another exemplary embodiment of a stacked package device according to the present disclosure. Elements in FIG. 1B-1 that are the same as or similar to those in FIG. 1B are not described again for brevity. In the embodiment, the structure of the stacked package device 200' is similar to that of the stacked package device 200 shown in FIG. 1B, except that the first portion 122a and the second portion 122b of the bonding wire 122 in the stacked package device 200' are not separated from each other by the encapsulating layer 120, but are connected to each other. The first portion 122a and the second portion 122b of the bonding wire 122 are entirely in the encapsulating layer 120 and thus are not exposed from the encapsulating layer 120. Namely, the encapsulating layer 120 fully covers the first portion 122a and the second portion 122b of the bonding wire 122.

Figure 2:
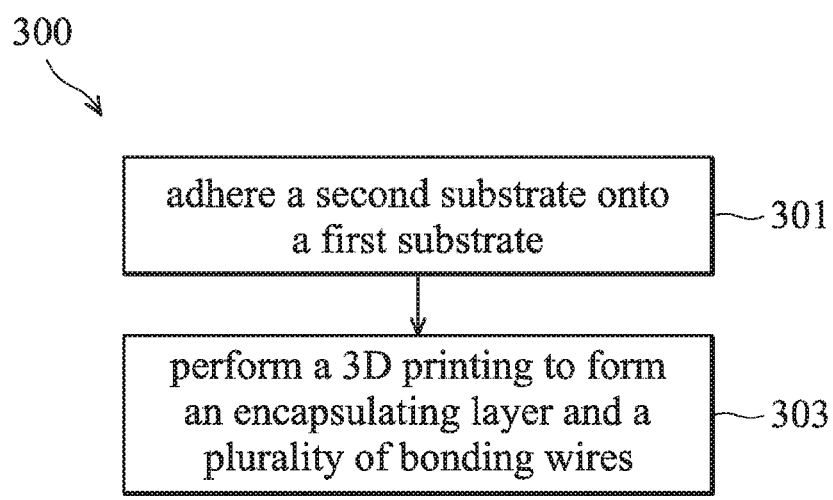
FIG. 2 shows a flow chart of a method for fabricating a stacked package device according to an embodiment of the present disclosure.

Next, refer to FIGS. 1A, 1B, and 2, in which FIGS. 1A to 1B are cross sections of a method for fabricating a stacked package device according to an embodiment of the present disclosure, and FIG. 2 shows a flow chart of a method 300 for fabricating a stacked package device according to an embodiment of the present disclosure. In the embodiment, the method 300 begins in step 301, in which a first substrate 100 and a second substrate 110 are provided. The size of the second substrate 110 may be the same as or smaller than that of the first substrate 100. Here, in order to simplify the description, an exemplary second substrate 110 having a size that is smaller than that of the first substrate 100 is depicted, as shown in FIG. 1A. In one embodiment, the first substrate 100 may include a PCB, a wafer, a chip, or a combination thereof. The first substrate 100 may include a plurality of first bonding pads 102 on the surface thereof. Moreover, the second substrate 110 may include a wafer, a chip, or a combination thereof. Similarly, the second substrate 110 includes a plurality of second bonding pads 112 on the surface thereof. Note that the number of first bonding pads 102 and the number of second bonding pads 112 are based on the demands of the design and are not limited to that shown in FIG. 1A. Here, in order to simplify the diagram, only two first bonding pads 102 and two second bonding pads 112 corresponding thereto are depicted.

Next, still referring to FIGS. 1A and 2, the second substrate 110 is adhered onto the first substrate 100. For example, an adhesion layer (not shown) may be formed on the upper surface of the first substrate 100 or on the lower surface of the second substrate 110, thereby using the adhesion layer to adhere the second substrate 110 onto the first substrate 100.

Next, referring to FIGS. 1B and 2, in step 303, a 3D printing 20 is performed using a 3D printer 10, to form an encapsulating layer 120 that covers the first substrate 100 and the second substrate 110, and to form a plurality of bonding wires 122 in the encapsulating layer 120. In the embodiment, the encapsulating layer 120 and the plurality of bonding wires 122 are simultaneously formed after performing the 3D printing 20. For example, during the 3D printing 20, the 3D printer 10 uses a first print head 10a to form the encapsulating layer 120, and uses a second print head 10a to form the plurality of bonding wires 122. Namely, the 3D printer 10 used for performing the 3D printing 20 may have at least two print heads so as to simultaneously form at least two different materials during the 3D printing 20.

In the embodiment, the encapsulating layer 120 may include a molding compound material, a ceramic material, a polymer material, a resin material, or a dielectric material used in 3D printing technology. Moreover, the plurality of bonding wires 122 may include a conductive metal used in 3D printing technology, such as gold, silver, copper, aluminum, their alloys, or other metal alloys.

In the embodiment, each bonding wire 122 formed in the encapsulating layer 120 has a first portion 122a and a second portion 122b, in which the first portion 122a of the bonding wire 122 is connected to one of the plurality of first bonding pads 102 of the first substrate 100, and the second portion 122b of the bonding wire 122 is connected to one of the plurality of second bonding pads 112 of the second substrate 110. In the embodiment, the formed encapsulating layer 120 may have the desired thickness by adjusting the printing program for the 3D printing 20. Moreover, the first portion 122a and the second portion 122b of the bonding wire 122 are separated from each other by the encapsulating layer 120, so that the first portion 122a and the second portion 122b of the bonding wire 122 respectively have one end being exposed from the encapsulating layer 120. As a result, the fabrication of the stacked package device 200 is completed, as shown in FIG. 1B.

In one embodiment, a chip or wafer (not shown) may be additionally adhered onto the encapsulating layer 120. In this case, the separated first portion 122a and second portion 122b of the bonding wire 122 can be connected by bonding pads on this chip or wafer. It should be understood that, since the formed bonding wire 122 has first and second portions 122a and 122b that are separated from each other and exposed from the surface of the encapsulating layer 120, it is not necessary to perform any polishing processes (e.g., chemical mechanical polishing) for exposing the bonding wire 122 from the surface of the encapsulating layer 120.

Additionally, refer to FIGS. 1A, 1B-1, and 2, in which FIGS. 1A and 1B-1 are cross sections of a method for fabricating a stacked package device according to another embodiment of the present disclosure, and FIG. 2 shows a flow chart of a method 300 for fabricating a stacked package device according to an embodiment of the present disclosure. In the embodiment, after step 301 of the method 300 (as shown in FIGS. 1A and 2), an encapsulating layer 120 and a plurality of bonding wires 122 shown in FIG. 1B-1 can be formed by step 303 of the method 300, thereby completing the fabrication of the stacked package device 200'. Unlike the embodiment of FIG. 1B, in the embodiment, the formed encapsulating layer 20 not only covers the first substrate 100 and the second substrate 110, but also fully covers the plurality of bonding wires 122. Moreover, the first portion 122a and the second portion 122b of the bonding wire 122 are not separated from each other by the encapsulating layer 20, but are connected to each other and respectively connected to the first bonding pad 102 and the second bond pad 112.

According to the foregoing embodiments, since the encapsulating layer and the plurality of bonding wires are formed by 3D printing, the manufacturing time for the stacked package device can be effectively reduced. Moreover, the material selection for the bonding wire has a high flexibility, and is not limited to a material with high ductility. Additionally, since the encapsulating layer and the plurality of bonding wires are simultaneously formed by 3D printing, the bonding wire can be prevented from oxidizing or experiencing problems of shifting, bridging and/or breaking. As a result, the reliability of the stacked package device can be increased. Moreover, compared to traditional wire bonding and encapsulation molding processes, the processes for fabricating the device can be effectively simplified, and the manufacturing cost can be reduced by using 3D printing to form the encapsulating layer and the plurality of bonding wires.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a stacked package device, comprising:
   adhering a second substrate onto a first substrate, wherein the first substrate comprises a plurality of first bonding pads, and the second substrate comprises a plurality of second bonding pads; and
   performing a three-dimensional (3D) printing to form an encapsulating layer covering the first substrate and the second substrate and to form a plurality of bonding wires in the encapsulating layer, wherein each bonding wire comprises a first portion connected to one of the plurality of first bonding pads.

2. The method as claimed in claim 1, wherein the encapsulating layer comprises a molding compound material, a ceramic material, a polymer material, a resin material, or a dielectric material.

3. The method as claimed in claim 1, wherein the plurality of bonding wires comprises gold, silver, copper, aluminum, or their alloys.

4. The method as claimed in claim 1, wherein each bonding wire comprises a second portion connected to one of the plurality of second bonding pads.

5. The method as claimed in claim 4, wherein the first portion and the second portion of the bonding wire are connected to each other, and fully covered by the encapsulating layer.

6. The method as claimed in claim 4, wherein the first portion and the second portion of the bonding wire are separated from each other, and respectively have one end that is exposed from the encapsulating layer.

7. The method as claimed in claim 1, wherein a 3D printer employed to perform the 3D printing has at least two print heads, so that at least two different materials are simultaneously formed during the 3D printing.

* * * * *